United States Patent [19]
Abe

[11] Patent Number: 5,132,100
[45] Date of Patent: Jul. 21, 1992

[54] OPTICALLY ACTIVE SINGLE CRYSTAL AND FABRICATION PROCESS THEREOF

[75] Inventor: Hiroaki Abe, Nagoya, Japan

[73] Assignee: NGK Insulators, Ltd., Nagoya, Japan

[21] Appl. No.: 500,345

[22] Filed: Mar. 28, 1990

[30] Foreign Application Priority Data

Mar. 30, 1989 [JP] Japan .................................. 1-79589

[51] Int. Cl.⁵ ...................... C30B 29/32; C30B 29/34
[52] U.S. Cl. ................................. 423/593; 156/617.1; 156/620.2; 156/620.3; 156/DIG. 64; 156/DIG. 65; 156/DIG. 67; 156/DIG. 79
[58] Field of Search ............... 156/617.1, 620.2, 620.3, 156/DIG. 64, DIG. 65, DIG. 67, DIG. 79; 423/593

[56] References Cited

U.S. PATENT DOCUMENTS

| | | | |
|---|---|---|---|
| 3,795,488 | 3/1974 | Oliver | 156/DIG. 79 |
| 4,121,965 | 10/1978 | Leipold | 156/DIG. 65 |
| 4,187,139 | 2/1980 | Brice et al. | 156/620.3 |
| 4,560,932 | 12/1985 | Mitsui et al. | 350/376 |
| 4,610,754 | 9/1986 | Gaida et al. | 156/DIG. 65 |
| 4,664,744 | 5/1987 | LeGal et al. | 156/DIG. 79 |
| 4,984,875 | 1/1991 | Abe et al. | 350/377 |

FOREIGN PATENT DOCUMENTS

| | | |
|---|---|---|
| 57-204023 | 12/1982 | Japan . |
| 58-140716 | 8/1983 | Japan . |
| 59-119334 | 7/1984 | Japan .......................... 156/DIG. 79 |
| 1-275499 | 11/1989 | Japan ................................. 156/617.1 |

OTHER PUBLICATIONS

Maier, "Rotation of the Plane of Polization by Single Crystals of Bismuth Silicate Bismuth Germanate", Izv. Akad Nauk USSR, Neorg. Mater 6(5) p. 1024.

Takano et al., "Classification of Twins", Mineralogical Journal, vol. 6, No. 5, pp. 375–382, Sep. 1971.

*Primary Examiner*—Robert Kunemund
*Attorney, Agent, or Firm*—Armstrong & Kubovcik

[57] ABSTRACT

Disclosed herein is an optically active single crystal, which has both levo-rotatory portion and dextro-rotatory portion and is even in optical rotatory power and physical constants such as electrooptic constant and Farady constant. Its fabrication process is also disclosed, wherein a single crystal is grown in accordance with the crystal pulling method making use of a seed crystal comprising a levo-rotatory single crystal and a dextro-rotatory single crystal, which are joined to each other. The process permits fabrication of the above-mentioned optically active single crystal in a short period of time and with ease.

11 Claims, 4 Drawing Sheets

OPTICALLY ACTIVE SINGLE CRYSTAL AND FABRICATION PROCESS THEREOF

FIELD OF THE INVENTION

This invention relates to an optically active single crystal and a fabrication method thereof, and more specifically to an optically active single crystal having both single-crystal portion exhibiting levorotation and single-crystal portion exhibiting dextrorotation and a fabrication process thereof.

Recently, a variety of optically functional devices having recourse to the rotatory polarization of substances have been produced. For example, bismuth silicon oxide ($Bi_{12}SiO_{20}$) (hereinafter may be called "BSO") and bismuth germanium oxide ($Bi_{12}GeO_{20}$) (hereinafter may be called "BGO") have electrooptic effect and Faraday effect in addition to optical activity. Various kinds of optical voltage sensors and optical magnetic-field sensors have been proposed making use of these oxides.

In the prior art disclosed in Japanese Patent Application Laid-Open No. 204023/1982 by way of example, there has been proposed an optical voltage sensor in which BSO or BGO as a crystal having both optical activity and electrooptic effect is used, and BSO or BGO having levorotation and BSO or BGO having dextrorotation are arranged along the traveling direction of light, whereby effects to improve the sensitivity of the sensor are achieved. Besides, in the prior art disclosed in Japanese Patent Application Laid-Open No. 140716/1983, there has been proposed an optical magnetic-field sensor in which BSO or BGO as a crystal having both optical activity and Faraday effect are used, and a BSO or BGO element having levorotation and a BSO or BGO element having dextrorotation, said the elements having the same length, are arranged along the traveling direction of light, whereby the natural optical activity of the sensor is counteracted and its temperature characteristics are improved.

As has been described above, both levo-rotatory crystal and dextro-rotatory crystal are used in the optically functional devices in order to improve the characteristics of optically active crystals. However, these levo-rotatory crystals and dextro-rotatory crystals have been separately fabricated for use in the prior art.

In order to fabricate such electrooptic elements and Faraday elements, however, levo-rotatory BSO or BGO having a desired size and dextro-rotatory BSO or BGO having a desired size must be separately fabricated. Accordingly, such fabrication is accompanied by problems that some considerable time is required for the fabrication and at the same time, irregularity tends to occur in crystalline characteristics between levorotation and dextrorotation, so that electrooptic elements and Faraday elements, which are both provided by combination of such levo-rotatory crystal and dextro-rotatory crystal, are insufficient in accuracy.

SUMMARY OF THE INVENTION

A principal object of this invention is to provide a novel optically active single crystal which has both levo-rotatory portion and dextro-rotatory portion and is even in optical rotatory power, and physical constants such as electrooptic effect and Faraday effect, the optically active single crystal being obtained by growing a single crystal in accordance with the crystal pulling method making use of a seed crystal comprising a levo-rotatory single crystal and a dextro-rotatory single crystal, which are joined to each other, and to provide a fabrication process, which permits production of an optically active single crystal having both levorotation and dextrorotation in a short period of time.

Another object of this invention is to provide an optically active single crystal having natural optical activity, which has been integrally constituted by a single-crystal portion exhibiting levorotation and a single-crystal portion exhibiting dextrorotation.

A further object of this invention is to provide an optically active single crystal in which the sectional-area ratio of a single-crystal portion exhibiting levorotation to a single-crystal portion exhibiting dextrorotation falls within the range of:

$$0.05 < \frac{\text{the sectional area of the levo-rotatory single crystal}}{\text{the sectional area of the dextro-rotatory single crystal}} < 20$$

A still further object of this invention is to provide an optically active single crystal in which the single crystal is composed of bismuth silicon oxide ($Bi_{12}SiO_{20}$).

A yet still further object of this invention is to provide an optically active single crystal in which the single crystal is composed of bismuth germanium oxide ($Bi_{12}GeO_{20}$).

A yet still further object of this invention is to provide an optically active single crystal in which the boundary plane between a single-crystal portion exhibiting levorotation and a single-crystal portion exhibiting dextrorotation is a (110) plane.

A yet still further object of this invention is to provide an optically active single crystal in which the boundary plane between a single-crystal portion exhibiting levorotation and a single-crystal portion exhibiting dextrorotation is a (100) plane.

A yet still further object of this invention is to provide a fabrication process of an optically active single crystal having natural optical activity, which comprises joining a levo-rotatory single crystal to a dextro-rotatory single crystal so as to provide a seed crystal and then pulling the seed crystal out of a melt composed of the same composition as that of the seed crystal so as to grow a single crystal composed of a single-crystal portion exhibiting levorotation and a single-crystal portion exhibiting dextrorotation.

A yet still further object of this invention is to provide a fabrication process of an optically active single crystal, in which the single crystal is fabricated in accordance with the crystal pulling method.

A yet still further object of this invention is to provide a fabrication process of an optically active single crystal, in which a seed crystal is obtained by joining the (110) plane of a levo-rotatory single crystal to the (110) plane of a dextro-rotatory single crystal.

A yet still further object of this invention is to provide a fabrication process of an optically active single crystal, in which a seed crystal is obtained by joining the (100) plane of a levo-rotatory single crystal to the (100) plane of a dextro-rotatory single crystal.

A yet still further object of this invention is to provide a fabrication process of an optically active single crystal, in which the sectional-area ratio of a levo-rotatory single crystal to a dextro-rotatory single crystal in a seed crystal falls within a range of:

$$0.05 < \frac{\text{the sectional area of the levo-rotatory single crystal}}{\text{the sectional area of the dextro-rotatory single crystal}} < 20$$

Other objects and advantages of the present invention will be readily appreciated from the preferred embodiments of this invention, which will be described subsequently in detail with reference to the accompanying drawings.

DETAILED DESCRIPTION OF THE PREFERRED EMBODIMENTS

Figure 1:
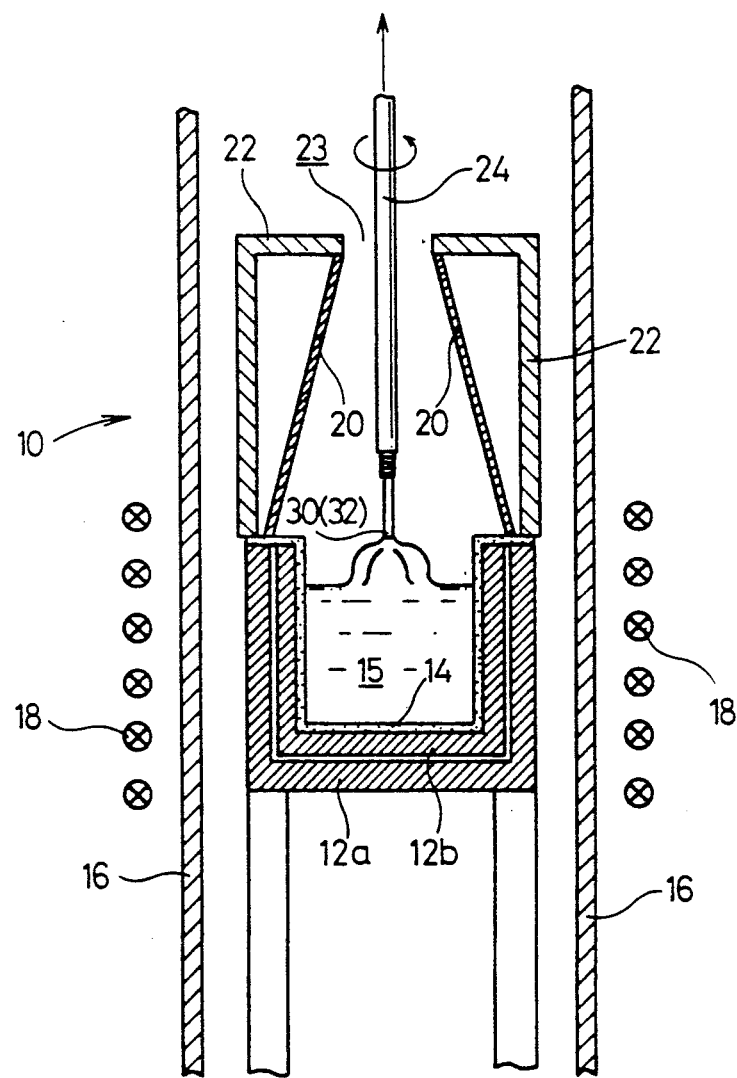
FIG. 1 is an explanatory illustration showing constitution of an apparatus for fabricating an optically active single crystal according to one embodiment of this invention.

In FIG. 1, numeral 10 indicates an apparatus for fabricating optically active single crystals according to this invention. This fabrication apparatus is equipped with a platinum-made crucible 14 surrounded by a refractory 12a, 12b of a dual structure. In the crucible 14 is contained sintered BSO 15, which is a material for an optically active single crystal. A high-frequency coil 18 is wound around a peripheral portion of the refractory 12a through a heat insulator 16 composed of an insulating material.

On the other hand, an after heater 20 made of platinum and having a conical shape, in which the internal space becomes gradually narrow toward its upper direction, is disposed on the upper opening of the crucible 14. The periphery of the after heater 20 is surrounded with a refractory 22. An upper opening 23 is defined in the upper end of the after heater 20. A pull shaft 24 is introduced toward the crucible 14 through the opening 23.

Figure 2B:
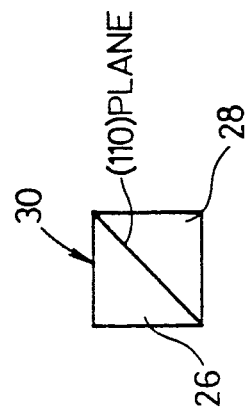
FIGS. 2(a) and 2(b) are a perspective view and an end elevation, respectively, of a seed crystal suitable for use in providing an optically active single crystal according to one embodiment of this invention.
Figure 3B:
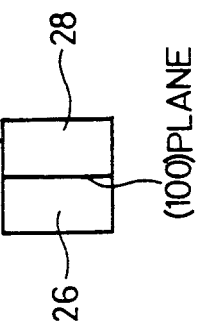
FIGS. 3(a) and 3(b) are a perspective view and an end elevation, respectively, of a seed crystal suitable for use in providing an optically active single crystal according to another embodiment of this invention.
Figure 2A:
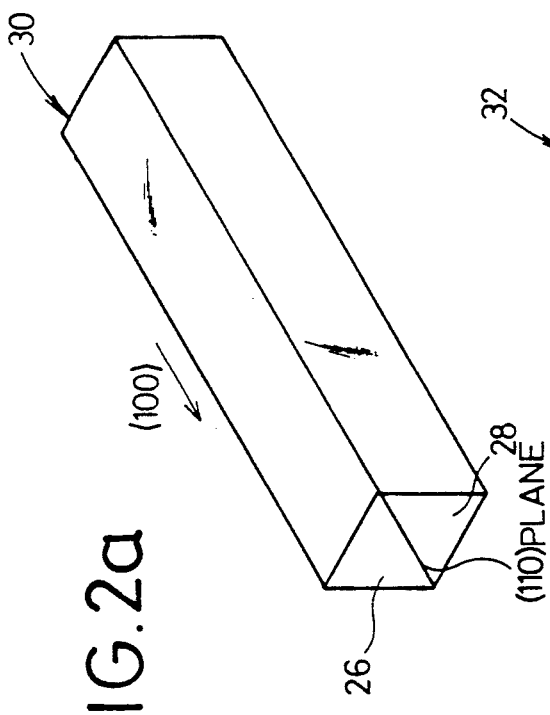
Figure 3A:
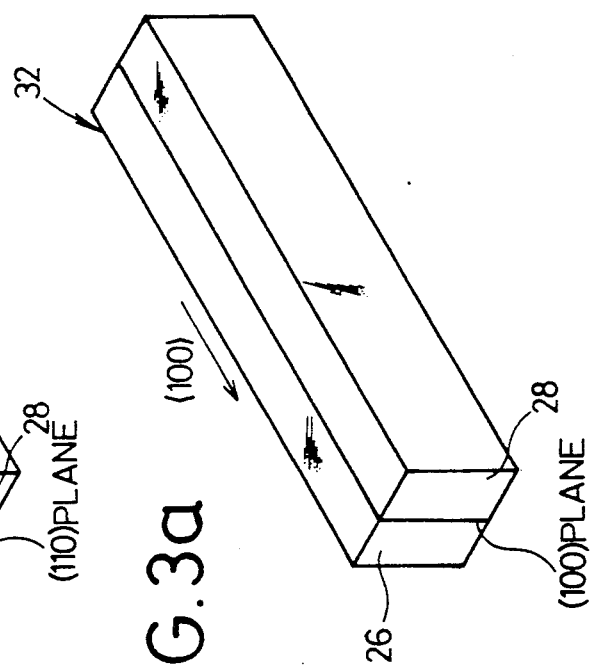

Incidentally, to the lower end of the pull shaft 24 is fitted a seed crystal 30 or 32 obtained by joining a levo-rotatory BSO single crystal 26, which is a first single crystal exhibiting levorotation, to a dextro-rotatory BSO single crystal 28, which is a second single crystal exhibiting dextrorotation, as illustrated in FIG. 2 or FIG. 3.

The fabrication apparatus 10 of the crystals according to this invention is basically constructed as described above. The fabrication process of optically active single crystals, in which the fabrication apparatus 10 is used, and optically active single crystals obtained thereby are then described.

A seed crystal 30 or 32 is first of all formed by joining a levo-rotatory BSO single crystal 26 to a dextro-rotatory BSO single crystal 28 (FIGS. 2 and 3). In this case, FIG. 2 illustrates a seed crystal 30 obtained by joining the (110) plane of the levo-rotatory BSO single crystal 26 to the (110) plane of the dextro-rotatory BSO single crystal 28, while FIG. 3 illustrates a seed crystal 32 obtained by joining the (100) plane of the levo-rotatory BSO single crystal 26 to the (100) plane of the dextro-rotatory BSO single crystal 28. By the way, the sectional-area ratio of the levo-rotatory BSO single crystal 26 to the dextro-rotatory BSO single crystal 28, these single crystals constituting the seed crystal 30 or 32, desirably falls within a range of:

$$0.05 < \frac{\text{levo-rotatory } BSO \text{ single crystal 26}}{\text{dextro-rotatory } BSO \text{ single crystal 28}} < 20$$

On the other hand, sintered BSO 15 in the form of powder is contained in the platinum-made crucible 14 and then heated to a predetermined temperature by a high-frequency coil 18 through the refractory 12a, 12b and the heat insulator 16. In this case, the sintered BSO 15 is transformed into a molten state in the crucible 14.

The seed crystal 30 or 32 illustrated in FIG. 2 or 3 is then fitted to the lower end of the pull shaft 24 in such a manner that the joint area of the seed crystal becomes parallel to the axis direction of the pull shaft 24. The thus-fitted seed crystal is inserted into the crucible 14 through the opening 23 of the platinum-made after heater 20.

The seed crystal 30 or 32 is then gradually pulled up while rotating it in the direction of an arrow in a condition that the melt of the sintered BSO 15 is held to the predetermined temperature. Incidentally, the platinum-made after heater 20 serves to control temperature at the periphery of the seed crystal 30 or 32.

Figure 4:
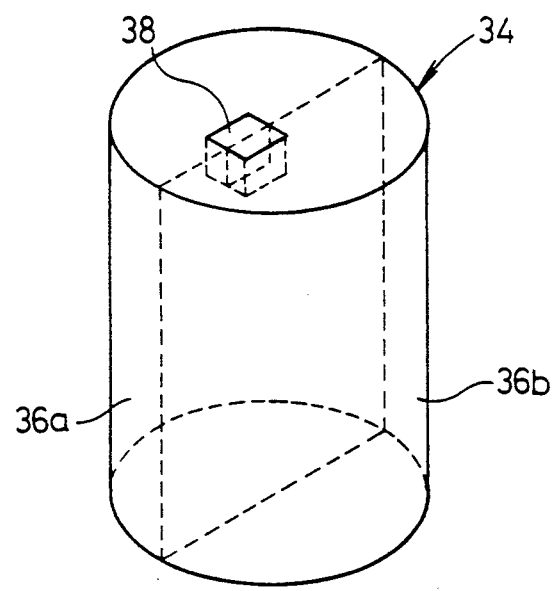
FIG. 4 is a perspective view illustrating an optically active single crystal provided in accordance with one embodiment of the process of this invention.

In the above-described manner, an ingot of a BSO single crystal 34 having both levorotation and dextrorotation is grown on the lower end of the seed crystal 30 or 32 (FIG. 4). In this case, the BSO single crystal 34 is integrally constituted by a single crystal portion 36a exhibiting levorotation and a single crystal portion 36b exhibiting dextrorotation. Therefore, a Faraday element 38 excellent in optical rotatory power relative to the magnetic field can be provided by cutting a part containing the single-crystal portions 36a and 36b in desired proportions out of the BSO single crystal 34. Incidentally, the sectional-area ratio of the single-crystal portion 36a to the single-crystal portion 36b desirably falls within a range of:

$$0.05 < \frac{\text{single-crystal portion 36a}}{\text{single-crystal portion 36b}} < 20$$

Figure 5:
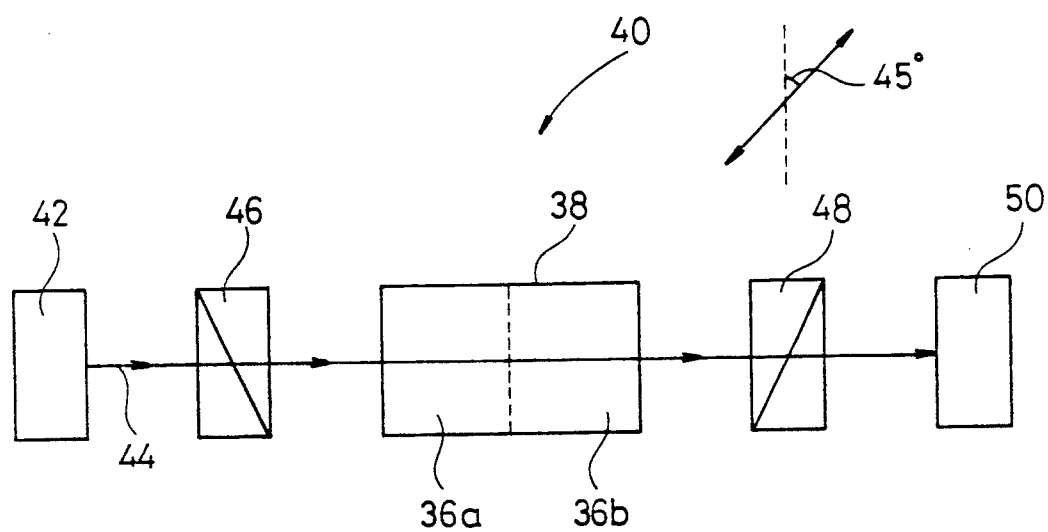
FIG. 5 is an explanatory block diagram of an optical magnetic-field sensor making use of a Faraday element obtained from an optically active single crystal according to one embodiment of this invention.

FIG. 5 is an explanatory block diagram of an optical magnetic-field sensor 40 making use of a Faraday element 38 obtained in the above-mentioned manner. Namely, a light beam 44 emitted from a light source 42 is converted into linearly polarized light by a polarizer 46 and then struck into the Faraday element 38. The light beam 44 passed through the Faraday element 38 is then introduced into a photodetector 50 through an analyzer 48 Now, when the optical magnetic-field sensor 40 is placed in a magnetic field, the linearly polarized light of the light beam 44, which has passed through the polarizer 46, is introduced in the photodetector 50 through the analyzer 48 in a condition that its plane of polarization is rotated in proportion to the intensity of the magnetic field by the Faraday element 38. In this case, the intensity of the magnetic field can be determined by output from the photodetector 50. Incidentally, since the Faraday element 38 is constituted by the single-crystal portions 36a and 36b, which are opposite in rotatory direction and are equal in optical rotatory power, both the effects of natural optical activity and temperature dependency are offset, whereby the intensity of the magnetic field can be determined with high accuracy.

EXAMPLE 1

A platinum-made crucible 14 having an external diameter of 150 mm and a height of 150 mm was charged with 14 kg of sintered BSO 15. The sintered BSO 15 was heated with a high-frequency coil 18 to melt it. The temperature of the resulting melt was controlled to 900° C. Thereafter, a seed crystal 30, whose longitudinal direction was a (100) direction and which had been obtained by joining the (110) plane of a levo-rotatory BSO single crystal 26 to the (110) plane of a dextro-rotatory BSO single crystal 28, was immersed in the melt, followed by pulling of a pull shaft 24 under conditions of 8 rpm in rotation rate and 1 mm/hr in pulling rate in accordance with the crystal pulling method to grow a BSO single crystal 34 of 60 mm across and 100 mm long After the BSO single crystal 34 thus obtained was cut along its (100) plane in a direction perpendicular to the pulling direction and was polished, it was disposed between crossed Nicols to observe it. As a result, it was found that the sectional-area ration of the single-crystal portion 36a exhibiting levorotation to the single-crystal portion 36b exhibiting dextrorotation was as follows:

$$\frac{\text{the sectional area of the levo-rotatory single crystal portion 36a}}{\text{the sectional area of the dextro-rotatory single crystal portion 36b}} = 1.2$$

and the boundary plane between the single-crystal portions 36a and 36b was a (110) plane. In addition, their crystal orientations were determined by X rays. It was found that the dislocation in crystal orientation between the single-crystal portion 36a and the single-crystal portion 36b was within 0.1°.

EXAMPLE 2

A platinum-made crucible 14 having an external diameter of 150 mm and a height of 150 mm was charged with 14 kg of sintered BSO 15. The sintered BSO 15 was heated with a high-frequency coil 18 to melt it. The temperature of the resulting melt was controlled to 900° C. A seed crystal 32, whose longitudinal direction was a (100) direction and which had been obtained by joining the (100) plane of a levo-rotatory BSO single crystal 26 to the (100) plane of a dextro-rotatory BSO single crystal 28, was then immersed in the melt, followed by pulling of a pull shaft 24 under conditions of 8 rpm in rotation rate and 1 mm/hr in pulling rate in accordance with the crystal pulling method to grow a BSO single crystal 34 of 60 mm across and 100 mm long.

After the BSO single crystal 34 thus obtained was cut along its (100) plane in a direction perpendicular to the pulling direction and was polished, it was disposed between crossed Nicols to observe it. As a result, it was found that the sectional-area ratio of the single-crystal portion 36a exhibiting levorotation to the single-crystal portion 36b exhibiting dextrorotation was as follows:

$$\frac{\text{the sectional area of the levo-rotatory single crystal portion 36a}}{\text{the sectional area of the dextro-rotatory single crystal portion 36b}} = 1.1$$

and the boundary plane between the single-crystal portions 36a and 36b was a (100) plane. In addition, their crystal orientations were determined by X rays. It was found that the dislocation in crystal orientation between the single-crystal portion 36a and the single-crystal portion 36b was within 0.1°.

Incidentally, in the examples described above, the cases where BSO was used as a material for the optically active single crystals have been demonstrated. However it is also possible to use a single crystal of BGO, $TeO_2$ or $Pb_5Ge_3O_{11}$, or the like in addition to BSO.

As described above, since the optically active single crystal according to this invention comprises a single crystal having both levo-rotatory single-crystal portion and dextro-rotatory single-crystal portion, the optical rotatory power of the optically active single crystal becomes even. It is hence possible to provide an optically active single crystal suitable for use as a Faraday element by way of example.

In addition, the optically active single crystal according to this invention is fabricated by using the crystal pulling method on the basis of a seed crystal obtained by joining a first single crystal exhibiting levorotation to a second single crystal exhibiting dextrorotation. It is therefore possible to provide a single crystal having both levorotation and dextro-rotation in a short period of time and also a single crystal even in optical rotatory power and in physical properties such as an electrooptic constant and a Faraday constant with ease.

Although the present invention has been described above with reference to the preferred embodiments thereof, it is to be understood that the invention is not limited thereto and that various modifications and changes in form and details can be made therein without departing from the spirit and scope of the invention.

What is claimed is:

1. An optically active single crystal having natural optical activity, comprising a single-crystal portion exhibiting levorotation and integral therewith a single-crystal portion exhibiting dextrorotation.

2. The optically active single crystal as claimed in claim 1, wherein the sectional-area ratio of the single-crystal portion exhibiting levorotation to the single-crystal portion exhibiting dextrorotation falls within a range of:

$$0.05 < \frac{\text{the sectional area of the levo-rotatory single crystal}}{\text{the sectional area of the dextro-rotatory single crystal}} < 20.$$

3. The optically active single crystal as claimed in claim 1, wherein the single crystal is composed of bismuth silicon oxide ($Bi_{12}SiO_{20}$).

4. The optically active single crystal as claimed in claim 1, wherein the single crystal is composed of bismuth germanium oxide ($Bi_{12}GeO_{20}$).

5. The optically active single crystal as claimed in claim 1, wherein the boundary plane between the single-crystal portion exhibiting levorotation and the single-crystal portion exhibiting dextrorotation is a (110) plane.

6. The optically active single crystal as claimed in claim 1, wherein the boundary plane between the single-crystal portion exhibiting levorotation and the single-crystal portion exhibiting dextrorotation is a (100) plane.

7. A process for the fabrication of an optically active single crystal having natural optical activity, which comprises:

joining a levo-rotatory single crystal to a dextro-rotatory single crystal so as to provide a seed crystal; and then pulling the seed crystal out of a melt so as to grow a single crystal composed of a single-crystal portion exhibiting levorotation and a single-crystal portion exhibiting dextrorotation.

8. The process as claimed in claim 7, further comprising rotating the seed crystal simultaneously with the step of pulling the seed crystal.

9. The process as claimed in claim 7, wherein the seed crystal is obtained by joining the (110) plane of the levo-rotatory single crystal to the (110) plane of the dextro-rotatory single crystal.

10. The process as claimed in claim 7, wherein the seed crystal is obtained by joining the (100) plane of the levo-rotatory single crystal to the (100) plane of the dextro-rotatory single crystal.

11. The process as claimed in claim 7, wherein the sectional-area ratio of the levo-rotatory single crystal to the dextro-rotatory single crystal in the seed crystal falls within a range of:

$$0.05 < \frac{\text{the sectional area of the levo-rotatory single crystal}}{\text{the sectional area of the dextro-rotatory single crystal}} < 20.$$

* * * * *